(12) United States Patent
La

(10) Patent No.: US 7,017,010 B2
(45) Date of Patent: Mar. 21, 2006

(54) INTEGRATED CIRCUIT MEMORY DEVICE SUPPORTING AN N BIT PREFETCH SCHEME AND A 2N BURST LENGTH

(75) Inventor: One-gyun La, Kyungki-do (KR)

(73) Assignee: Samsung Electronics Co., Ltd., (KR)

( * ) Notice: Subject to any disclaimer, the term of this patent is extended or adjusted under 35 U.S.C. 154(b) by 270 days.

(21) Appl. No.: 10/338,398

(22) Filed: Jan. 8, 2003

(65) Prior Publication Data

US 2003/0135697 A1    Jul. 17, 2003

(30) Foreign Application Priority Data

Jan. 11, 2002   (KR) ................................ 2002-1774

(51) Int. Cl.
*G06F 12/00*    (2006.01)

(52) U.S. Cl. ...................... 711/137; 711/157; 711/168; 711/213; 711/218

(58) Field of Classification Search ................ 711/137, 711/168, 157, 213, 217–219
See application file for complete search history.

(56) References Cited

U.S. PATENT DOCUMENTS

| | | | |
|---|---|---|---|
| 6,115,321 A | 9/2000 | Koelling et al. | |
| 6,191,997 B1 * | 2/2001 | Son et al. | 365/230.04 |
| 6,708,264 B1 * | 3/2004 | Abe et al. | 711/169 |
| 6,795,899 B1 * | 9/2004 | Dodd et al. | 711/137 |
| 2002/0108013 A1 * | 8/2002 | Coteus et al. | 711/2 |

FOREIGN PATENT DOCUMENTS

KR    0167629    1/1999

OTHER PUBLICATIONS

Ryan, Kevin. "DDR SDRAM Functionality and Controller Read Data Capture," *DesignLine, Micron Technology, Inc.* vol. 8, Issue 3, 1999.

* cited by examiner

*Primary Examiner*—Matthew D. Anderson
(74) *Attorney, Agent, or Firm*—Myers Bigel Sibley & Sajovec, P.A.

(57) ABSTRACT

The present invention provides a dual data rate (DDR) integrated circuit memory device that is configured to support an N to 2N prefetch-to-burst length mode of operation. The DDR integrated circuit memory device is further configured to support a sequential address increase scheme and an interleave address increase scheme.

11 Claims, 6 Drawing Sheets

INTEGRATED CIRCUIT MEMORY DEVICE SUPPORTING AN N BIT PREFETCH SCHEME AND A 2N BURST LENGTH

RELATED APPLICATION

This application is related to and claims priority from Korean Patent Application No. 2002-1774 filed Jan. 11, 2002, the disclosure of which is hereby incorporated herein by reference.

FIELD OF THE INVENTION

The present invention relates to integrated circuit devices and, more particularly, to synchronous dynamic random access memories (SDRAMs).

BACKGROUND OF THE INVENTION

To improve the operational speed of integrated circuit devices, integrated circuit memory devices have rapidly developed from fast operation mode dynamic random access memories (DRAMs), such as fast page mode DRAMs or extended data output (EDD) DRAMs, to SDRAMs and from SDRAMs to dual data rate (DDR) DRAMs. A number of DRAM manufacturing companies are currently researching the next generation of memory devices after the DDR SDRAMs. For example, the next generation may use DDR2 SDRAMs having a 4-bit prefetch scheme instead of the conventional DDR SDRAMs having a 2-bit prefetch scheme.

The Joint Electronic Device Engineering Council (JEDEC) recommended that DDR2 SDRAMs use a 4-bit prefetch scheme as well as a fixed burst length of 4-bits. In integrated circuit memory devices having a 4-bit prefetch scheme and a fixed burst length of 4-bits, 2-bits of a 4-bit input column address signal that activates a plurality of column select lines are not utilized. In other words, if 2-bits of the 4-bit column address signal are not utilized, only four column select lines may be automatically activated by the column address signal. Furthermore, in integrated circuit memory devices having a 4-bit prefetch scheme and a fixed burst length of 4-bits, the order of data is determined based on a first input column address and the type of address increase scheme used, for example, a sequential address increase scheme or an interleave address increase scheme.

The four column select lines that correspond to the four possible modes using 2-bits of the 4-bit column address signal, i.e., 00, 01, 10, and 11, respectively, are activated in a mode where a burst length is 4-bits, regardless of the starting column address. For example, if the 2-bits of the start column address are 00, the 2-bits of a column address corresponding to a column select line which have to be generated with the start column address 00 are 01, 10, or 11. Accordingly, if the start column address is 01, the 2-bits of a column address corresponding to a column select line which have to be generated with the start column address 01 are 10, 11, or 00.

As described above, if a burst length of 4-bits is used with a 4-bit prefetch scheme, the number of bits to be prefetched is four and the number of sequentially input/output data, i.e., the burst length, is 4-bits. Accordingly, since these lengths are the same, a mode where the burst length is 4-bits may be realized in an integrated circuit memory device using the 4-bit prefetch scheme. However, if the burst length is 8-bits not all the column select lines may be selected using 2-bits of the column address as discussed above. To provide the possibility of eight column select lines, 3-bits are considered if a sequential address increase scheme is used. However, 3-bits do not have to be considered if an interleave address increase scheme is used.

Conventional integrated circuit memory devices having a 2-bit prefetch scheme and a burst length of 4-bits typically include an address counter. The address counter generates addresses corresponding to column select lines that will be generated for the next cycle using 2-bits of the 4-bit column address signal. Therefore, it may be difficult for the integrated circuit memory device using a 4-bit prefetch scheme and a burst length of 8-bits to support a sequential address increase scheme, because as discussed above, 3-bits are typically considered. Accordingly, JEDEC recommends that the burst length of 4-bits be fixed in a DDR2 SDRAM.

An integrated circuit memory device using the 4-bit prefetch scheme is likely to have an address counter which generates addresses corresponding to column select lines that will be generated for next cycle. However, this 4-bit prefetch scheme may be complicated. Furthermore, if the clock cycles are reduced, the internal margin of the integrated circuit device may become short, limiting the operational frequency of the integrated circuit device.

The demand for a burst length of 8-bits has increased because the speed of the integrated circuit memory device can be increased accordingly. If the number of bits to be prefetched is increased to increase the speed of the integrated circuit memory device, the number of internal data input/output (I/O) lines is also typically increased. Some conventional SDRAMs may operate in a mode where the burst length is 8-bits and a nibble sequential address increase scheme is used to meet the demand for the burst length of 8-bits. However, it may be complicated to realize general SDRAMs for supporting the burst length of 8-bits. This may also present difficulties in supporting the sequential address increase scheme, which is generally used in SDRAMs using a prefetch scheme.

SDRAMs using the prefetch scheme typically use the sequential address increase scheme or the interleave address increase scheme. However, SDRAMs using the nibble sequential address increase scheme typically do not support a normal sequential address increase scheme.

Accordingly, integrated circuit devices that support a burst length of 8-bits or twice the number of bits to be prefetched, for example, 4-bits, that can support both sequential and interleave address increase schemes may be desirable.

SUMMARY OF THE INVENTION

Embodiments of the present invention provide an integrated circuit device including a dual data rate (DDR) integrated circuit memory device that is configured to support an N to 2N prefetch-to-burst length mode of operation.

In some embodiments of the present invention, the DDR integrated circuit memory device is configured to support a sequential address increase scheme and an interleave address increase scheme. In certain embodiments the prefetch N is 4 and the burst length 2N is 8. In further embodiments, the prefetch N is 2 and the burst length 2N is 4.

In further embodiments of the present invention, the DDR integrated circuit memory device further includes a pre-decoder and a memory cell array. The pre-decoder receives a 3-bit column address signal and generates a plurality of pre-decoding signals. The memory cell array includes at least one memory cell array block for storing the 2N burst length of data. The pre-decoding signals activate a column select line that designates the position of the 2N burst length of data in memory cell array block of the memory cell array.

In still further embodiments of the present invention, the at least one memory cell array block includes first to fourth memory cell blocks. The DDR integrated circuit memory device may further include a data position controller that is configured to determine the position of the 2N burst length of data in the first through fourth memory cell array blocks based on a first bit and a second bit of the 3-bit column address signal.

In some embodiments of the present invention, the pre-decoder further includes a logic circuit that activates at least one logic signal in response to a mode control signal. The mode control signal may include a burst length control signal that indicates the 2N burst length, wherein a logic high indicates that the 2N burst length is a 4-bit burst length and a logic low indicates the 2N burst length is an 8-bit burst length, a sequential mode signal that indicates use or the sequential address increase scheme when the sequential mode signal is a logic high, and an interleave mode signal that indicates use of the interleave address increase scheme when the interleave mode signal is a logic high.

In further embodiments of the present invention, the at least one logic signal is responsive to the 3-bit column address signal. In certain embodiments of the present invention the least one logic signal includes first through eighth logic signals, the burst length control signal is a logic low and the sequential mode signal is a logic high. Each of the first through eighth logic signals are responsive to a first bit, a second bit and a third bit of the 3-bit column address signal.

In still further embodiments, the at least one logic signal may include first through eighth logic signals, the burst length control signal is a logic high and the interleave mode signal is a logic high. The first logic signal and the fifth logic signal are responsive to a third bit of the 3-bit column address signal.

In some embodiments of the present invention, the at least one logic signal includes first through eighth logic signals. The logic circuit may be further configured to activate one of the first through eighth logic signals and to combine the activated logic signal with the next three sequential logic signals to form a first group of four logic signals. The logic circuit may be further configured to form a second group of four logic signals including the remaining four of the first through eighth logic signals not combined with the activated signal to form the first group. The first group of logic signals may be activated during a first cycle of the clock in response to a first control signal and wherein the second group of logic signals may be activated during a second cycle of the clock in response to a second control signal.

DETAILED DESCRIPTION OF EMBODIMENTS OF THE PRESENT INVENTION

Figure 1:
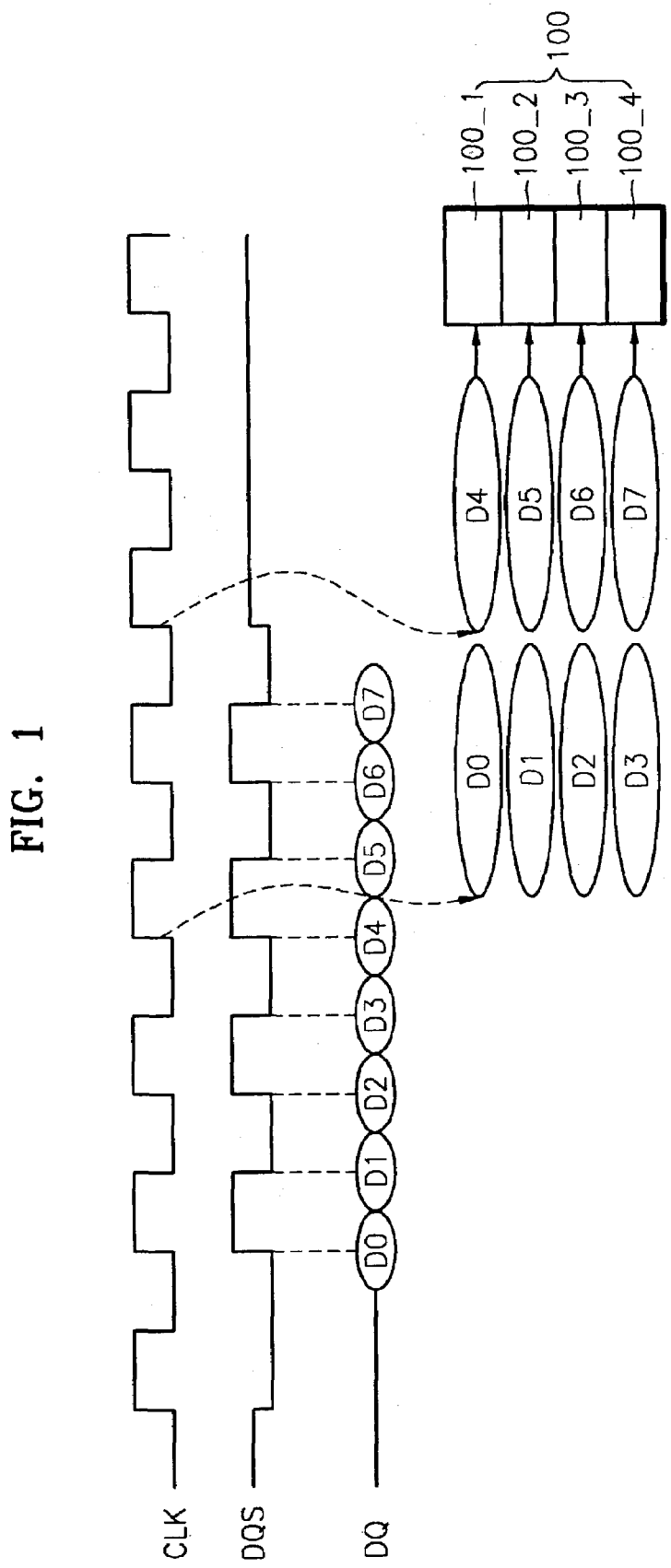
FIG. 1 is a timing diagram illustrating the operation of synchronous dynamic random access memories (SDRAMs) according to embodiments of the present invention.

The present invention now will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, when an element is referred to as being "connected" or "coupled" to another element, it can be directly connected or coupled to the other layer or intervening elements may be present. In contrast, when an element is referred to as being "directly connected" or "directly coupled" to another element, there are no intervening elements present. Like reference numerals refer to like elements throughout.

Embodiments of the present invention will be described below with respect to FIGS. 1 through 6. Embodiments of the present invention provide an integrated circuit device including a dual data rate (DDR) integrated circuit memory device that is configured to support an N to 2N prefetch-to-burst length mode of operation. In some embodiments of the present invention, the integrated circuit device can support both the existing sequential and interleave address increase schemes. Integrated circuit devices according to embodiments of the present invention provide the above by including a 012 pre-decoder 500 that outputs first through eighth pre-decoding signals DCA012<i>(i=0–7) using 3-bits CA2, CA1, and CA0 of a column address CA to control column select lines for selecting columns where data will be input to and output from. Four of the first through eighth pre-decoding signals DCA012<i>(i=0–7) output from the 012 pre-decoder 500 are activated during the first cycle based on the start column address and the other four pre-decoding signals are activated during the second cycle after the first through eighth pre-decoding signals (DCA012<i>, i=0–7) are inverted. Accordingly, an integrated circuit memory device according to embodiments of the present invention may not include a complicated circuit such as a counter for generating a column address in the integrated circuit memory device. Furthermore, since it is possible to control the order of how the data is input and/or output using 2-bits CA1 and CA0 of the column address CA, the order can also be used when the burst length is 4-bits.

Referring now to FIG. 1, operations of synchronous dynamic random access memories (SDRAMs) according to embodiments of the present invention will be discussed. Embodiments of the SDRAM illustrated in FIG. 1 utilizes an N to 2N prefetch-to-burst length ratio, for example, a 4-bit prefetch scheme and a burst length is 8-bits. Accordingly, 8-bits of data D0 through D7 are sequentially input and/or output (I/O) via a data pin DQ of an integrated circuit memory device. It will be understood that integrated circuit devices according to embodiments of the present invention may include one or more data pins DQ without departing from the teachings of the present invention.

An address for a memory cell is selected for the data input into the integrated circuit substrate via data I/O pin DQ. A single memory cell address is selected for all 8-bits of data D0 through D7. Once the address is selected, a command is issued to input data. As illustrated in the timing diagram of FIG. 1, the 8-bits of data D0 through D7 are input on the rising and falling edges of a data strobe signal DQS. The data strobe signal DQS initiates the input of data and adjusts the synchronization of data with respect to the clock signal CLK. The data strobe signal DQS is synchronized with the clock signal CLK, i.e. has the same cycle and waveform as the clock CLK, when data is being input (read) into the integrated circuit memory device via data pin DQ, but has a predetermined level when data is not being input into the integrated circuit device.

For example, data may be sequentially input into the integrated circuit device. In other words, D0 may be input first and D7 may be input last (or eighth). Using a 4-bit prefetch scheme, the first four bits of data D0, D1, D2 and D3 are serially input into the integrated circuit device and converted into parallel data. The serial to parallel conversion is performed while the data is being synchronized with a rising edge of a next clock CLK after the fourth data bit D3 is input into the integrated circuit memory device. The parallel converted data is input into four memory cell array blocks 100_i (i=1–4) simultaneously. The whole memory cell array of the SDRAM using the 4-bit prefetch scheme may be divided into four memory cell array blocks 100_i (i=1–4).

The last four data bits D4, D5, D6 and D7 are input sequentially into the integrated circuit device and converted into parallel data while being synchronized with a rising edge of the next clock after the eighth data bit D7 is input. The parallel data may also be input into the four memory cell array blocks 100_i (i=1–4) simultaneously.

The data may be output (written) from the integrated circuit device utilizing a method similar to the method described above with respect to inputting the data bits D0 through D7. In other words, four data bits are sensed at a time in parallel from the four memory cell array blocks 100_i (i=1–4) simultaneously and converted into serial data. The serial data is output via the data pin DQ to, for example, a device outside the integrated circuit memory device.

Figure 2:
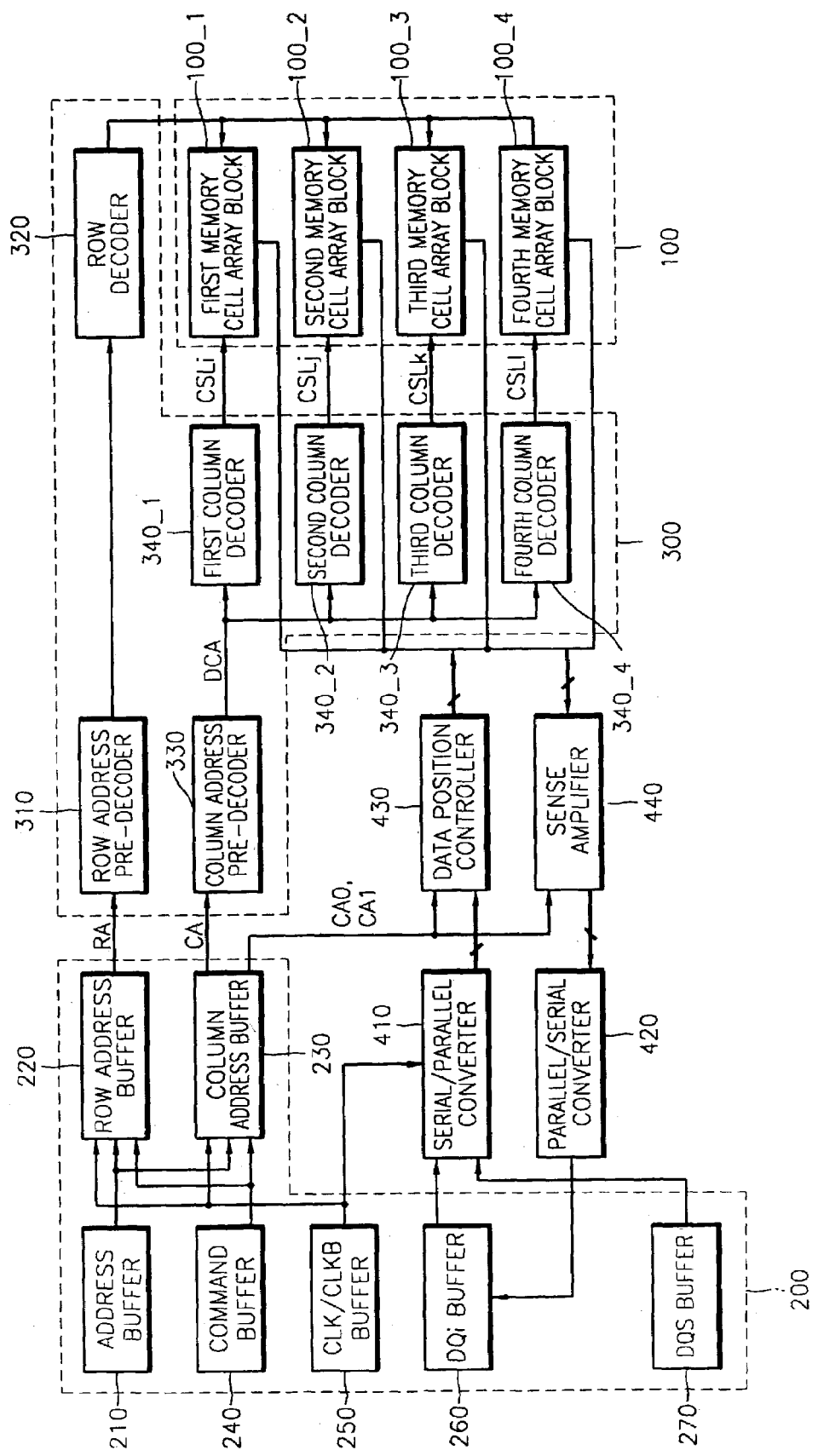
FIG. 2 is a block diagram illustrating integrated circuit memory devices according to embodiments of the present invention.

Now referring to FIG. 2, a block diagram illustrating an integrated circuit memory device according to embodiments of the present invention will be discussed. As illustrated in FIG. 2, the integrated circuit memory device includes a memory cell array 100, a buffer 200, a decoder 300, a serial to parallel converter 410, a parallel to serial converter 420, a data position controller 430, and a sense amplifier 440.

The memory cell array 100 may be divided into a plurality of memory cell array blocks. As illustrated in FIG. 2, in certain embodiments, the memory cell array 100 is divided into four memory cell array blocks 100_i (i=1, 2, 3, 4). The serial to parallel converter 410 changes the serial data sequentially input into the integrated circuit device into parallel data. In other words, for every N data input serially there is a corresponding N parallel data. The parallel to serial converter 420 converts the N parallel data output from the memory cell array 100 back into N serial data.

In certain embodiments of the present invention, an integrated circuit memory device having a burst length of 8-bits sequentially inputs and/or outputs 8-bits of serial data via one data pin DQi. The serial to parallel converter 410 converts 4-bits of serial data sequentially received via the data pin DQi into parallel data, and the parallel to serial converter 420 converts 4-bits of parallel data to 4-bits of serial data and sequentially outputs the serial data via the data pin DQi.

The data position controller 430 positions the 4-bits of data based on the use of a sequential address increase scheme or an interleave address increase scheme. In other words, the data position controller 430 determines the positions of the 4-bits of data in the four memory cell array blocks 100_i (i=1, 2, 3, 4).

The decoder 300 translates an address that designates a memory cell for the data to be input to and/or output from in the memory cell array 100. The decoder 300 includes a row address pre-decoder 310, a row decoder 320, a column address pre-decoder 330, and first through fourth column decoders 340_i (i=1, 2, 3, 4).

The row address pre-decoder 310 pre-translates a row address RA that is input into the integrated circuit memory device. Here, the row address RA consists of a plurality of bits, and a predetermined number of bits can be consecutively pre-translated for a predetermined number of times. The row decoder 320 translates a signal that is output from the row address pre-decoder 310, selects one row (word line) from each of the memory cell array blocks 100_i (i=1, 2, 3, 4), and activates the selected row.

The column address pre-decoder 330 pre-translates a column address CA that is input into the integrated circuit memory device. The column address pre-decoder 330 classifies a plurality of bits of a column address CA into a plurality of groups, each of which includes a predetermined number of bits, and decodes the bits to generate a pre-decoding signal DCA. The column address pre-decoder 330 includes a 012 pre-decoder (not shown in FIG. 2) that is described further below with reference to FIG. 3.

The first through fourth column decoders 340_i (I=1, 2, 3, 4) receive the pre-decoding signal DCA from the column address pre-decoder 330, decode the pre-decoding signal DCA, and activate one column select line. The sense amplifier 440 amplifies the data output from the memory cell array 100. The sense amplifier 440 also controls the positions of the 4-bits of parallel data output from the memory cell array 100, i.e., the order of the 4-bits of parallel data. The function of the sense amplifier 400 is similar to a function of the data position controller 430 that controls the order of the input data, therefore, further description of the sense amplifier will be omitted.

The buffer 200 receives a signal from, for example, a device outside of the memory device, and converts the signal into an internal signal. The buffer 200 may also convert an internal signal into an external signal. In certain embodiments, the buffer 200 latches the signal. As illustrated, the buffer 200 includes an address buffer 210, a row address buffer 220, a column address buffer 230, a command buffer 240, a clock buffer 250, a data buffer 260, and a data strobe signal buffer 270.

The address buffer 210 stores an address signal that is input via an address pin. The row address buffer 220 and the column address buffer 230 stores a row address signal and a column address signal, respectively, in response to a predetermined command to output the row address RA and the column address CA. The clock buffer 250 stores a clock CLK that is input via a clock pin, and the data strobe signal buffer 270 stores a data strobe signal DQS. The data buffer 260 stores data that is input/output via each data pin DQi.

Figure 3:
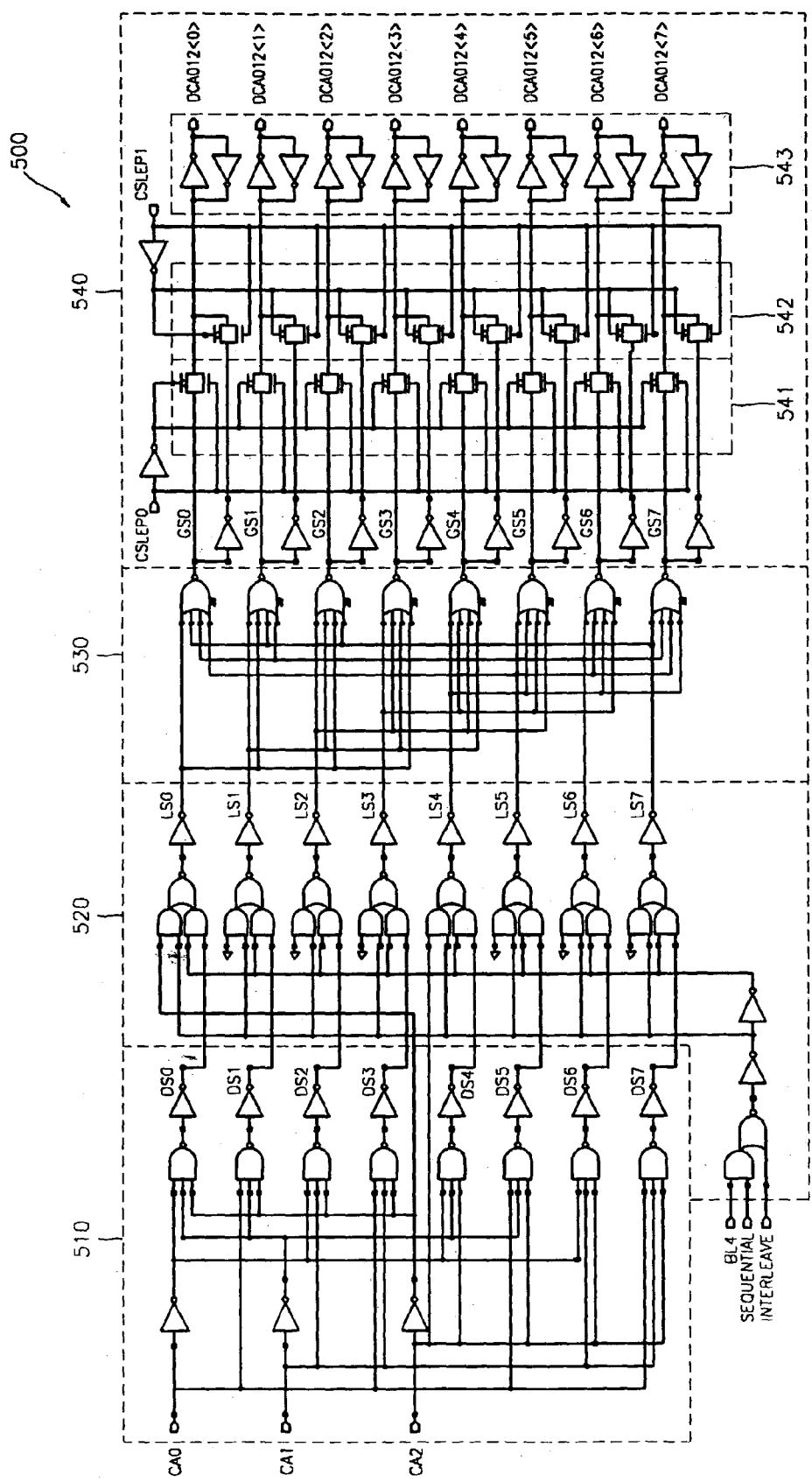
FIG. 3 is a circuit diagram illustrating a portion of a column address pre-decoder shown in FIG. 2 according to embodiments of the present invention.

Referring now to FIG. 3, a circuit diagram illustrating a portion of the column address pre-decoder 330 illustrated in FIG. 2 will be discussed. The circuit shown in FIG. 3, which is included in the column address pre-decoder 330 of FIG.

2, receives and pre-decodes 3-bits CA2, CA1, and CA0 of the column address CA. The circuit shown in FIG. 3 is a 012 pre-decoder 500. The 012 pre-decoder 500 pre-translates the 3-bits CA2, CA1, and CA0 of the column address CA to generate first through eighth pre-decoding signals DCA012<i>(i=0–7). The first through eighth pre-decoding signals DCA012<i>(i=0–7) are input to the first through fourth column decoders 340_i (i=1, 2, 3, 4) with other pre-decoding signals, which activates a plurality of column select lines that designate the columns where the 8-bits of parallel data will be input to and/or output from.

As illustrated in FIG. 3, The 012 pre-decoder 500 includes a decoding unit 510, a logic circuit 520, a grouping unit 530, and a pre-decoding signal generator 540. The decoding unit 510 translates 3-bits CAi (i=0–2) of the column address CA to generate first through eighth output signals DSi (i=0–7), only one of which is activated. If the 3-bits CA2, CA1, and CA0 of the column address CA are 000, 001, 010, 100, 011, 101, 110 or 111, the 012 decoder 500 activates a first output signal DS0, a second output signal DS1, a third output signal DS2, a fourth output signal DS3, a fifth output signal DS4, a sixth output signal DS5, a seventh output signal DS6 or an eighth output signal DS7, respectively.

To perform the above function the decoding unit 510 may include a plurality of inverters and/or a plurality of AND gates. In embodiments of the present invention illustrated in FIG. 3, each of the AND gates is realized by a 3-input NAND gate and an inverter. The first bit CA0 of the column address CA or an inverted signal of the first bit CA0, the second bit CA1 of the column address signal CA or an inverted signal of the second bit CA1, and the third bit CA2 of the column address signal CA or an inverted signal of the third bit CA2 are input to each of the NAND gates of the decoding unit 510.

The logic circuit 520 receives the first through eighth output signals DSi (i=0–7) from the decoding unit 510 and outputs first through eighth logic signals LSi (i=0–7), only one of which is activated according to a predetermined mode control signal. The mode control signal includes a burst length control signal BL4 representing the burst length of the integrated circuit memory device, a sequential mode signal SEQUENTIAL representing a sequential address increase scheme, and an interleave mode signal INTERLEAVE representing an interleave address increase scheme. The burst length control signal BL4 is logic high level (1) when the burst length of the integrated circuit is set to 4-bits. The sequential mode signal SEQUENTIAL is set to a logic high level when the sequential address increase scheme is used and the interleave mode signal INTERLEAVE is set to a logic high level when the interleave address increase scheme is used.

In certain embodiments of the present invention, the burst length of the integrated circuit memory device is 8-bits and the sequential address increase scheme is used. In these embodiments, signals of the first through eighth logic signals LSi (i=0–7) corresponding to the activated signals of the first through eighth signals DSi (i=0–7) output from the decoder 510 are activated. In other words, one of the first through eighth logic signals LSi (i=0–7) corresponding to the 3-bits CA2, CA1, and CA0 of the column address CA is activated. If the 3-bits CA2, CA1, and CA0 are 000, respectively, the first logic signal LS0 is activated. If the 3-bits CA2, CA1, and CA0 are 001, respectively, the second logic signal LS1 is activated and so on. In particular, 010 corresponds to logic signal LS2, 100 corresponds to logic signal LS3, 011 corresponds to logic signal LS4, 101 corresponds to logic signal LS5, 110 corresponds to logic signal LS6 and 111 corresponds to logic signal LS7.

In further embodiments of the present invention, the burst length of the integrated circuit memory device is 4-bits and the interleave address increase scheme is used. In these embodiments, the first logic signal LS0 or the fifth logic signal LS4 is activated according to the 3-bits CA2, CA1, and CA0 of the column address CA. In other words, the first logic signal LS0 is activated if the third bit CA2 is 0 and the fifth logic signal LS4 is activated if the third bit CA2 is 1. Accordingly, the first 2-bits CA1 and CA0 of the column address CA are not considered in these embodiments.

To perform the above function, the logic circuit 520 may include a plurality of 2-input AND gates, a plurality of NOR gates, and a plurality of inverters as illustrated in FIG. 3. The grouping unit 530 combines four hard-wired sequential signals of the first through eighth logic signals LSi (i=0–7) output from the logic circuit 520 into a group or plurality of groups. In other words, the activated logic signal is combined with the three sequential logic signals directly following the activated logic signal into a first group, four signals of the group being activated at the same time.

For example, if the first logic signal LS0 is set to a logic high, signals GS0 through GS3 corresponding to the first through fourth logic signals LS0 through LS3 are combined into a first group and activated in a logic low (0) at the same time. Signals GS4 through GS7 corresponding to the remaining logic signals, i.e., the fifth through eighth logic signals LS4 through LS7, are combined into a second group and not activated in a logic high. By way of further example, if the second logic signal LS1 is activated, the signals GS1 through GS4 corresponding to the second through fifth logic signals LS1 through LS4 are combined into a first group and activated to a logic low at the same time. The other signals GS5 through GS7 and GS0 are combined into a second group and output. Signals belonging to the first group that are activated and signals belonging to the second group that are not activated are determined according to the logic signals that are activated by the above method.

To generate the signals belonging to the first and second groups, the grouping unit 530 may include a plurality of 4-input NOR gates, as illustrated in FIG. 3. As illustrated, the 4-input NOR gates correspond to the signals GSi (i=0–7), respectively. The 4-input NOR gates receive four sequential logic signals, perform a NOR operation on the four sequential logic signals, and output a signal belonging to the first group or the second group. The logic signal received by the 4-input Nor gates depends on a value of K. Each of the 4-input NOR gates receives a $K^{th}$ logic signal. If the value of K is a natural number from 4 to 8, each of the 4-input NOR gates receives a K logic signal, a K–1 logic signal, a K–2 logic signal, and a K–3 logic signal. If, on the other hand, the value of K is a natural number from 1 to 3, the 4-input NOR gates receive a K logic signal, a K+7 logic signal, a K+6 logic signal, and a K+5 logic signal. Accordingly, depending on the embodiment, K may be a natural number between 1 and 8.

For example, if K is 4, the 4-input NOR gate performs a NOR operation for the fourth logic signal LS3 (K), the third logic signal LS2 (K–1), the second logic signal LS1 (K–2) and the first logic signal LS0 (K–3) and outputs the fourth logic signal GS3 corresponding to K, i.e., 4. If K is between 5 and 8, the 4-input NOR gate performs the same operations as when K is 4. If, on the other hand, K is 1, the 4-input NOR gate performs a NOR operation for the first logic signal LS0 (K), the eighth logic signal LS7 (K+7), the seventh logic signal LS6 (K+6), and the sixth logic signal LS5 (K+5) and outputs the signal GS0 corresponding to K, i.e., 1. If K is 2 or 3, the 4-input NOR gate performs the same operations as when K is 1.

The pre-decoding signal generator 540 includes a first switch group 541 and a second switch group 542 which are turned on and/or off in response to a first control signal CSLEP0 and a second control signal CSLEP1, respectively. Switches belonging to the first switch group 541 are turned on in response to the first control signal CSLEP0 and output the signals GS0 through GS7 belonging to the first and second groups as the first through eighth pre-decoding signals DCA012<i>(i=0–7). Therefore, if the first control signal CSLEP0 is activated, signals of the first through eighth pre-decoding signals DCA012<i>(i=0–7) corresponding to the first group are activated in logic high and signals corresponding to the second group are not activated and remain at a logic low.

Switches belonging to the second switch group 542 are turned on in response to the second control signal CSLEP1 and output the inverted signals of the signals GS0 through GS7 belonging to the first and second groups as the first through eighth pre-decoding signals DCA012<i>(i=0–7). Therefore, if the second control signal CSLEP1 is activated, signals of the first through eighth pre-decoding signals DCA012<i>(i=0–7) corresponding to the first group are not activated and remain at a logic low and signals corresponding to the second group are activated to a logic high.

To latch the first through eighth pre-decoding signals DCA012<i>(i=0–7), the pre-decoding signal generator 540 may further include a latch 543 which inputs the signal output from an first inverter into a second inverter. The first and second control signals CSLEP0 and CSLEP1 are generated for a first cycle of the clock CLK and a second cycle of the clock CLK, respectively. During the first cycle of the clock CLK, 4-bits of the 8-bits of parallel data that is first converted into parallel data are input and/or output. During the second cycle of the clock CLK, the other 4-bits of parallel data are input and/or output. In certain embodiments of the present invention, there is about a two CLK cycle difference between the first cycle and the second cycle.

For example, if signals GS0 through GS3 of the signals GS0 through GS7 output from the grouping unit 530 belong to the first group, the first through fourth pre-decoding signals DCA012<i>(i=0–3) are activated to a logic "high" for the first cycle of the clock CLK. The remaining signals GS4 through GS7, thus, belong to the second group and are not activated and remain at a logic low level.

The signals GS0 through GS7 are inverted and output from the grouping unit 530, i.e., the signals belonging to the first and second groups. The signals that belong to the first group are not activated and the signals that belong to the second group are activated. The inverted signals belonging to the first and second groups are output as the first through eighth pre-decoding signals DCA012<i>(i=0–7) in response to the second control signal CSLEP1 that is activated for the second cycle of the clock CLK. Thus, the fifth through eighth pre-decoding signals DCA012<i>(i=4–7) are activated for the second cycle of the clock CLK. In other words, the fifth through eighth pre-decoding signals DCA012<i>(i=4–7) are activated to a logic "high" for the second cycle of the clock CLK according to the signals belonging to the second group.

Referring now to FIGS. 2 and 3, the process of selecting a column that data will be input to or output from, according to the first through eighth pre-decoding signals DCA012<i>(i=1–7) will be described. The first and fifth pre-decoding signals DCA012<0>, DCA012<4> are input to a first column decoder 340_1 of FIG. 2. The second and sixth pre-decoding signals DCA012<1>, DCA012<5> are input to a second column decoder 340_2 of FIG. 2. The third and seventh pre-decoding signals DCA012<2>, DCA012<6> are input to a third column decoder 340_3 of FIG. 2. The fourth and eighth pre-decoding signals DCA012<3>, DCA012<7> are input to a fourth column decoder 340_4 of FIG. 2. The first through fourth column decoders 340_1 through 340-4 are not shown in detail and receive other pre-decoding signals, respectively.

The first through fourth column decoders 340_i (i=0–4) activate column select lines CSLi, CSLj, CSLk, and CSLl, respectively, each of which designates one column in a corresponding one of the memory cell array blocks 100_i (i=1–4), according to each of the received pre-decoding signals DCA. In particular, the first column decoder 340_1 activates one column select line CSLi in the first memory cell array block 100_1. The second column decoder 340_2 activates one column select line CSLj in the second memory cell array block 100_2. The third column decoder 340_3 activates one column select line CSLk in the third memory cell array block 100_3. The fourth column decoder 340_4 activates one column select line CSLl in the fourth memory cell array block 100_4.

The data position controller 430 controls which data is input into and/or output from each of columns that are designated by the activated column select lines CSLi, CSLj, CSLk, and CSLl. The data position controller 430 will be discussed further below.

Referring now to tables 1 and 2 set out below. Table 1 illustrates various signals discussed above with respect to FIG. 3. In particular, the values of the following signals are illustrated: CA2, CA1, CA0, DS0 through DS7, LS0 through LS7, CS0 through CS7 and DCA012<0:7>. Table 1 illustrates the values of these signals when the integrated circuit device has a bit length of 8-bits and uses a sequential address increase scheme. In other words, Table 1 illustrates the signal values when BL4=0, INTERLEAVE=0 and SEQUENTIAL=1.

TABLE 1

| | | | | | | DCA012<0:7> | |
|---|---|---|---|---|---|---|---|
| CA2 | CA1 | CA0 | DS0–DS7 | LS0–LS7 | GS0–GS7 | CSLEP0 | CSLEP1 |
| 0 | 0 | 0 | 10000000 | 10000000 | 00001111 | 11110000 | 00001111 |
| 0 | 0 | 1 | 01000000 | 01000000 | 10000111 | 01111000 | 10000111 |
| 0 | 1 | 0 | 00100000 | 00100000 | 11000011 | 00111100 | 11000011 |
| 0 | 1 | 1 | 00010000 | 00010000 | 11100001 | 00011110 | 11100001 |
| 1 | 0 | 0 | 00001000 | 00001000 | 11110000 | 00001111 | 11110000 |
| 1 | 0 | 1 | 00000100 | 00000100 | 01111000 | 10000111 | 01111000 |

TABLE 1-continued

|     |     |     |         |         |          | DCA012<0:7> |          |
| --- | --- | --- | ------- | ------- | -------- | ----------- | -------- |
| CA2 | CA1 | CA0 | DS0–DS7 | LS0–LS7 | GS0–GS7  | CSLEP0      | CSLEP1   |
| 1   | 1   | 0   | 00000010| 00000010| 00111100 | 11000011    | 00111100 |
| 1   | 1   | 1   | 00000001| 00000001| 00011110 | 11100001    | 00011110 |

Furthermore, Table 2 illustrates the values of the signals set out above when the integrated circuit device either has a bit length of 4-bits and uses an sequential address increase scheme, i.e., BL4=1 and SEQUENTIAL=1 or uses a interleave address increase scheme, i.e., when INTERLEAVE=1.

TABLE 2

|     |     |     |         |         |          | DCA012<0:7> |          |
| --- | --- | --- | ------- | ------- | -------- | ----------- | -------- |
| CA2 | CA1 | CA0 | DS0–DS7 | LS0–LS7 | GS0–GS7  | CSLEP0      | CSLEP1   |
| 0   | 0   | 0   | 10000000| 10000000| 00001111 | 11110000    | 00001111 |
| 0   | 0   | 1   | 01000000| 10000000| 00001111 | 11110000    | 00001111 |
| 0   | 1   | 0   | 00100000| 10000000| 00001111 | 11110000    | 00001111 |
| 0   | 1   | 1   | 00010000| 10000000| 00001111 | 11110000    | 00001111 |
| 1   | 0   | 0   | 00001000| 00001000| 11110000 | 00001111    | 11110000 |
| 1   | 0   | 1   | 00000100| 00001000| 11110000 | 00001111    | 11110000 |
| 1   | 1   | 0   | 00000010| 00001000| 11110000 | 00001111    | 11110000 |
| 1   | 1   | 1   | 00001000| 00001000| 11110000 | 00001111    | 11110000 |

Figure 4:
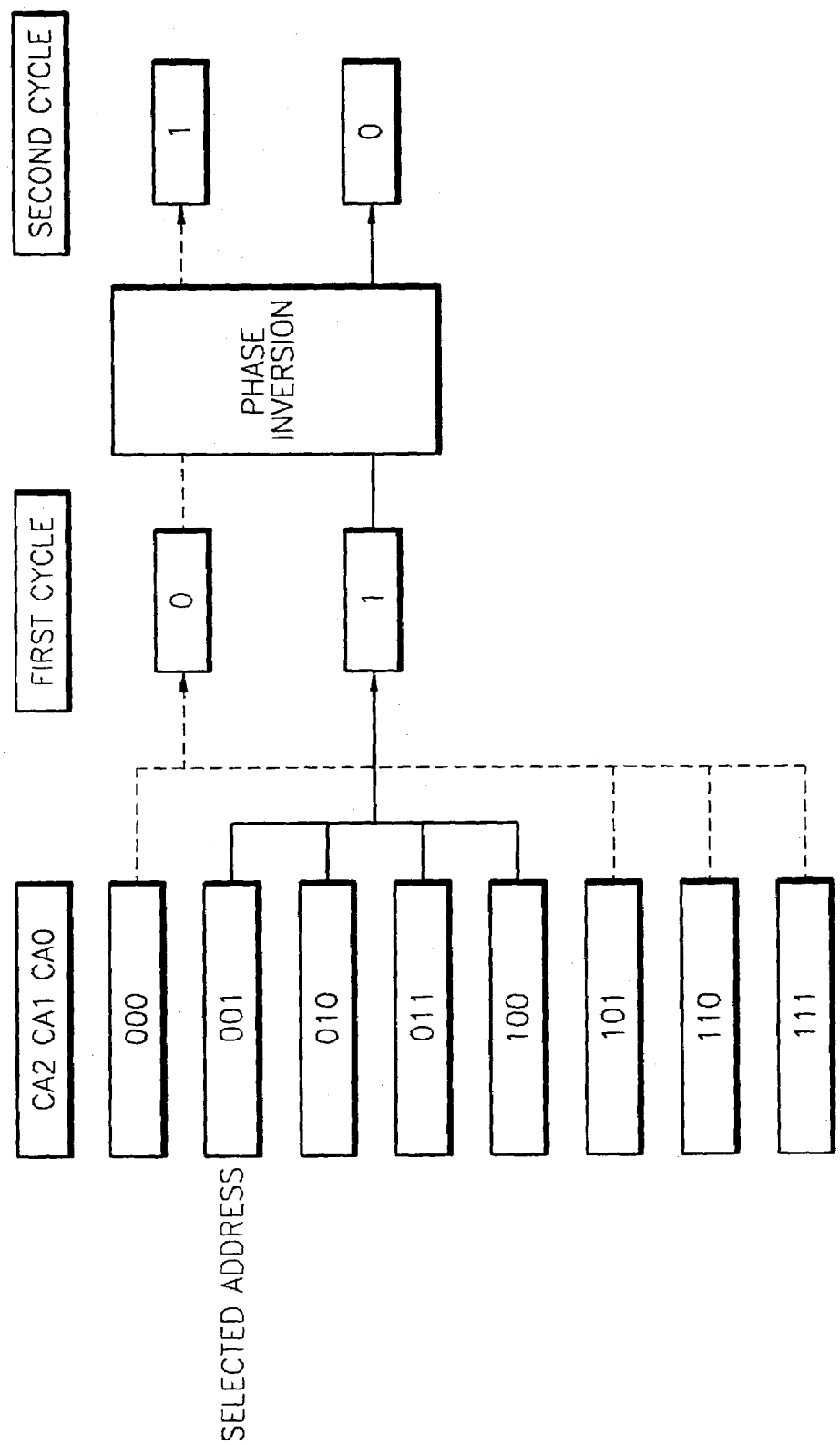
FIG. 4 is a diagram illustrating operations of a pre-decoder shown in FIG. 3 according to embodiments of the present invention.

Referring now to FIG. 4, a diagram illustrating the operation of the 012 pre-decoder 500 shown in FIG. 3 according to embodiments of the present invention will be discussed. As illustrated in FIG. 4, the 012 pre-decoder 500 receives 3-bits CA2, CA1, and CA0 of the column address CA. The 3-bits of the column address CA form eight combinations that range from 000 to 111. The example illustrated in FIG. 4 assumes that the 3-bits CA2, CA1, and CA0 of the column address CA that are input with a read/write command before 8-bits of serial data are input, i.e., a selected address, are "001" and that a the sequential address increase scheme is used.

Referring to both FIGS. 3 and 4, if 001 is input as 3-bits of the column address CA, the decoding unit 510 translates 001 and activates the second output signal DS1. As discussed above, in embodiments of the present invention having an 8-bit integrated circuit memory device and operating in sequential mode, the burst length control signal BL4 and the interleave mode signal INTERLEAVE are set to a logic low, and the sequential mode signal SEQUENTIAL is set to a logic high. Accordingly, the logic circuit 520 that is controlled by the burst length signal BL4, the interleave signal INTERLEAVE, and the sequential mode signal SEQUENTIAL, activates the second logic signal LS1 corresponding to the second output signal DS1.

If the second logic LS1 is activated, the grouping unit 530 groups the signal GS1 corresponding to the second logic signal LS1 and three signals GS2, GS3, and GS4 following the signal GS1 as the first group and activates the signals GS1 through GS4.

During the first cycle, the second through fifth pre-decoding signals DCA012<i>(i=1–4) corresponding to the signals GS1 through GS4 that belong to the first group are activated on high level 1 under control of the first control signal CSLPE0 and pre-decoding signals DCA012<i>(i=0, 5, 6, 7) corresponding to the signals GS5 through GS7 and GS0 that belong to the second group are not activated at a low level 0. Each of the second through fifth pre-decoding signals DCA012<i>(i=1–4) correspond to 3-bits CA2, CA1, and CA0 of the column address CA that are 001, 010, 011 or 100. Each of the first and sixth through eighth pre-decoding signals DCA012<i>(i=0, 5, 6, 7), correspond to 3-bits CA2, CA1, and CA0 of the column address CA that are 000, 101, 110, or 111.

During the second cycle, the first and sixth through eighth pre-decoding signals DCA012<i>(i=0, 5, 6, 7) that were not activated during the first cycle are activated on high level "1" due to the inversion of the first through eighth pre-decoding signals DCA012<i>(i=0–7). During this cycle, the first through eighth pre-decoding signals DCA012<i> (i=0–7) are inverted by inverting the signals GS1 through GS4 belonging to the first group and the signals GS5 through GS7 and GS0 belonging to the second group.

Figure 5:
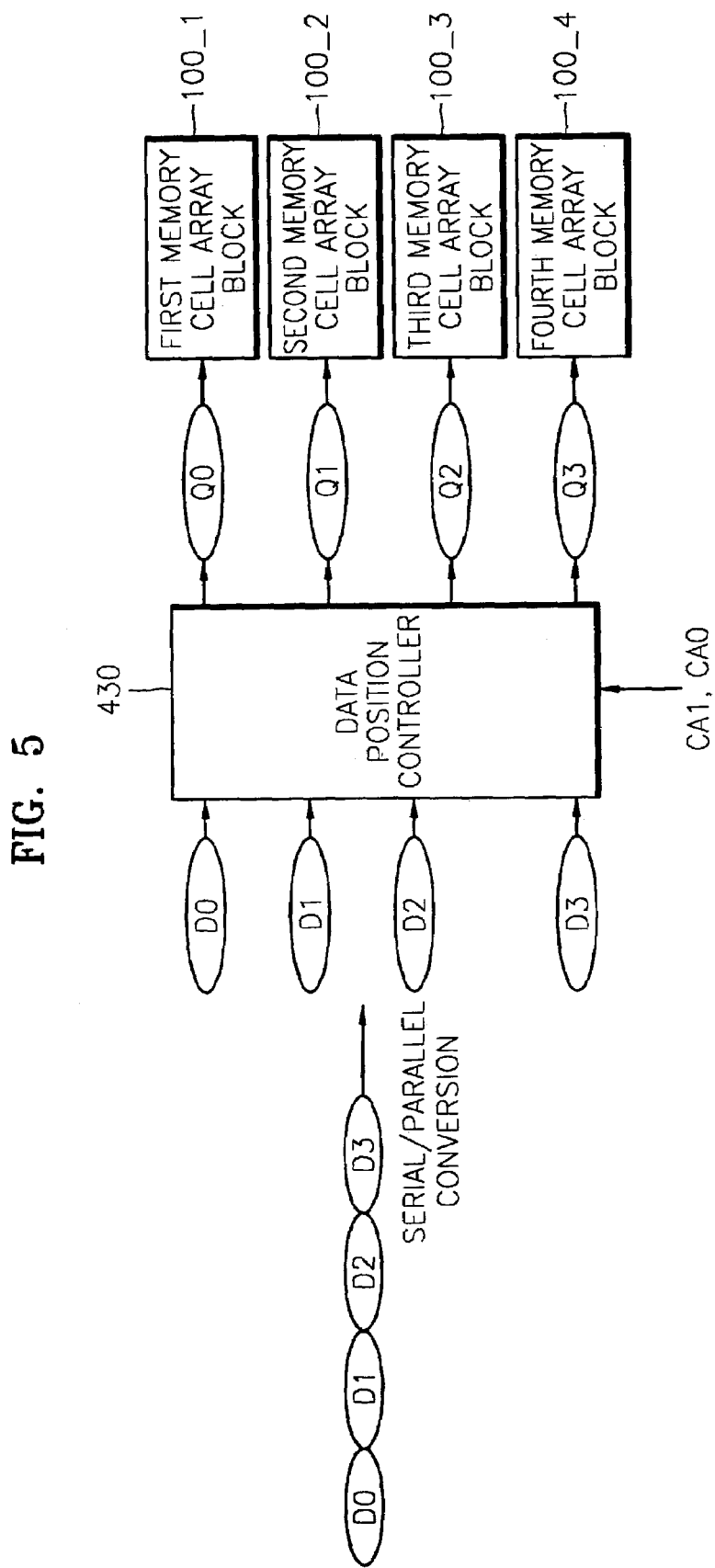
FIG. 5 is a diagram illustrating operations of a data position controller shown in FIG. 2 according to embodiments of the present invention.

Referring now to FIG. 5, a diagram illustrating operations of the data position controller 430 shown in FIG. 2 will be discussed. A process according to certain embodiments of the present invention for controlling the positions of 4-bits of data D0 through D3 that are sequentially input via one data pin DQ will be described.

If the burst length is 8-bits, the data position controller 430 can control the positions of 4-bits of parallel data D0 through D3 using only 2 bits CA1 and CA0 of the column address CA as when the burst length is 4-bits.

In certain embodiments of the present invention, data is input from, for example, a device outside the memory device, i.e., data is written to the memory device. For example, as illustrated in FIG. 5, four sequential serial data bits D0 through D3 are converted into parallel data bits by the serial to parallel convertor. The data position controller 430 controls the position of the parallel data D0 through D3 in one of four memory cell array blocks 100_i (i=1–4). To input and/or output data, one input and/or output (I/O) line Qi (i=1–3) corresponding to each of the four memory cell array blocks 100_i (i=1–4) is included. In other words, first through fourth I/O lines Q0 through Q3 are connected to first through fourth memory cell array blocks 100_1 through 100_4, respectively.

Figure 6:
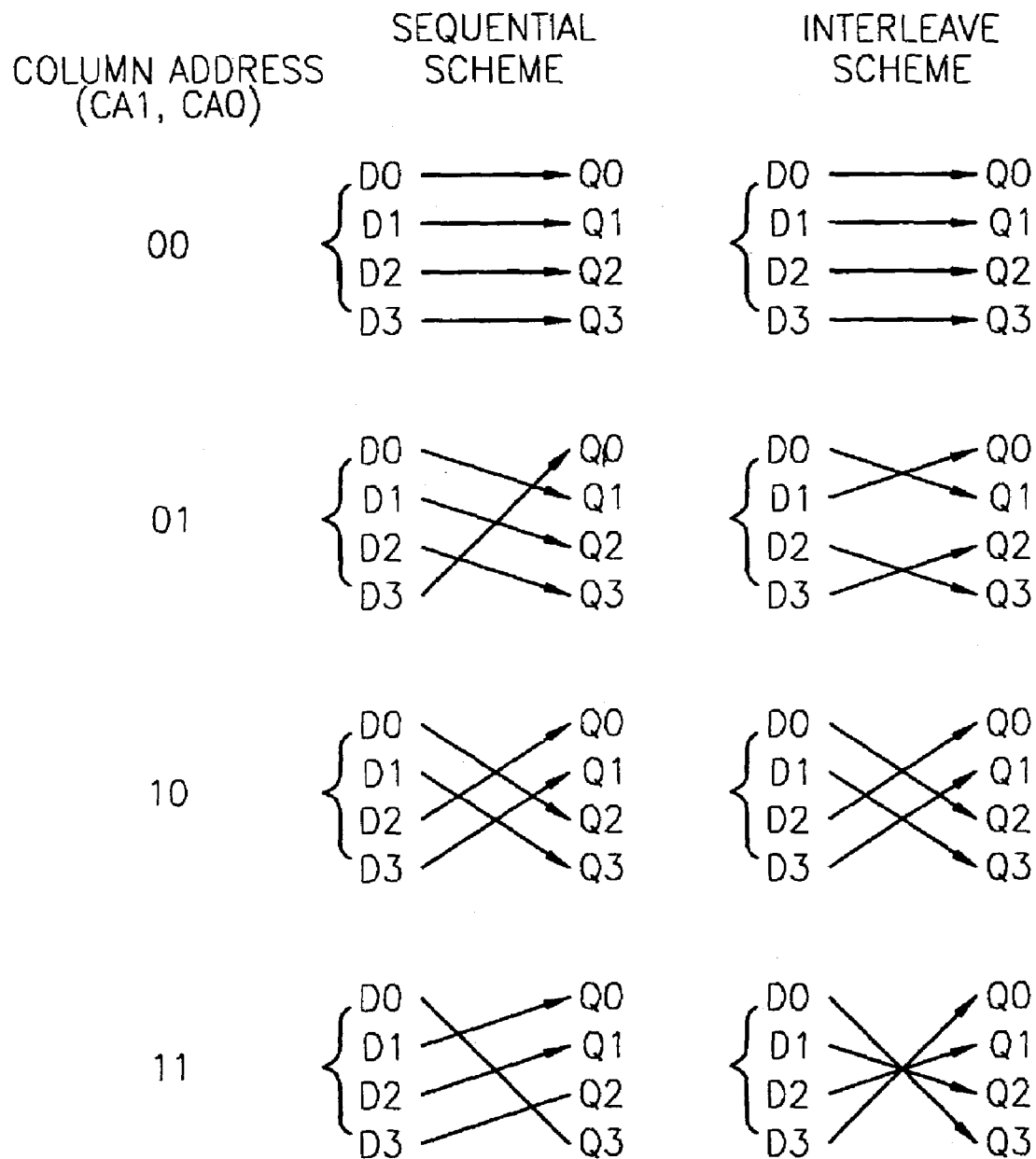
FIG. 6 is a diagram illustrating the location of data using to various address schemes according to embodiments of the present invention.

Referring now to FIG. 6, a diagram illustrating the positions of data according to address increase schemes according to embodiments of the present invention will be discussed. As discussed above, address increase schemes may include, for example, a sequential address increase scheme and/or an interleave address increase scheme.

As illustrated in FIG. 6, if 2-bits CA1 and CA0 of the column address CA are 00, the first through fourth data D0 through D3 are input to the first through fourth I/O lines Q0 through Q3, respectively, in either the sequential address increase scheme or the interleave address increase scheme.

As further illustrated in FIG. 6, if 2-bits CA1 and CA0 of the column address CA are 01, the first through fourth data D0 through D3 are input to the second through third and first I/O lines Q1 through Q2 and Q0, respectively, in the sequential address increase scheme. However, the first through fourth data D0 through D3 are input to the second, first, fourth, and third I/O lines Q1, Q0, Q3, and Q2, respectively, in the interleave address increase scheme.

As further illustrated in FIG. 6, if 2-bits CA1 and CA0 of the column address CA are 10, the first through fourth data D0 through D3 are input to the third, fourth, first, and second I/O lines Q2, Q3, Q0, and Q1, respectively, in either the sequential address increase scheme or the interleave address increase scheme.

As further illustrated in FIG. 6, if 2 bits CA1 and CA0 of the column address CA are 11, the first through fourth data D0 through D3 are input to the fourth, first, second, and third I/O lines Q3, Q0, Q1, and Q2, respectively, in the sequential address increase scheme. However, the first through fourth data D0 through D3 are input to the fourth, third, second, and first I/O lines Q3, Q2, Q1, and Q0, respectively, in the interleave address increase scheme.

The operation of the integrated circuit memory device with respect to the other 4-bits of parallel data D4 through D7 is similar to the operation described above with respect to first 4-bits of parallel data D0 through D3 with reference to FIGS. 5 and 6, therefore, further description of these operations will be omitted. Furthermore, data that is output from the memory cell array blocks is output similar to the operation described above with respect to inputting data into the memory cell array blocks, therefore, further description of this operation will also be omitted. It will be understood that the sense amplifier 440 illustrated in FIG. 2 controls the positions of output data.

As briefly described above with respect to FIGS. 1 through 6, embodiments of the present invention provide an integrated circuit device including a dual data rate (DDR) integrated circuit memory device that is configured to support an N to 2N prefetch-to-burst length mode of operation. In some embodiments of the present invention, the integrated circuit device can support both the existing sequential and interleave address increase schemes. Integrated circuit devices according to embodiments of the present invention include a 012 pre-decoder 500 that outputs first through eighth pre-decoding signals DCA012<i>(i=0–7) using 3-bits CA2, CA1, and CA0 of a column address CA to control column select lines for selecting columns where data will be input to and output from. Four of the first through eighth pre-decoding signals DCA012<i>(i=0–7) output from the 012 pre-decoder 500 are activated during the first cycle based on the start column address and the other four pre-decoding signals are activated during the second cycle after the first through eighth pre-decoding signals (DCA012<i>, i=0–7) are inverted. Accordingly, an integrated circuit memory device according to embodiments of the present invention may not include a complicated circuit such as a counter for generating a column address in the integrated circuit memory device. Furthermore, since it is possible to control the order of how the data is input and/or output using 2-bits CA1 and CA0 of the column address CA, the order can also be used when the burst length is 4-bits.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device comprising:
a dual data rate (DDR) integrated circuit memory device that is configured to support an N to 2N prefetch-to-burst length mode of operation, where N is a positive integer, wherein the DDR integrated circuit memory device is further configured to support a sequential address increase scheme and an interleave address increase scheme and wherein the DDR integrated circuit memory device further comprises:
a pre-decoder that generates a plurality of pre-decoding signals responsive to a 3-bit column address signal; and
a memory cell array including at least one memory cell array block for storing the 2N burst length of data, wherein the pre-decoding signals activate at least one column select line that designates the position of the 2N burst length of data in the at least one memory cell array block of the memory cell array.

2. The integrated circuit device according to claim 1, wherein N is 4 and wherein 2N is 8.

3. The integrated circuit device according to claim 1, wherein N is 2 and wherein 2N is 4.

4. The integrated circuit device according to claim 1, wherein the at least one memory cell array block comprises first to fourth memory cell blocks, the device further comprising a data position controller that is configured to determine the position of the 2N burst length data in the first through fourth memory cell array blocks based on a first bit and a second bit of the 3-bit column address signal.

5. The integrated circuit device according to claim 1, wherein the pre-decoder further comprises a logic circuit that activates at least one logic signal in response to a mode control signal, wherein the mode control signal comprises:
a burst length control signal that indicates the 2N burst length, wherein a logic high indicates that the 2N burst length is a 4-bit burst length and a logic low indicates the 2N burst length is an 8-bit burst length;
a sequential mode signal that indicates use or the sequential address increase scheme when the sequential mode signal is a logic high; and
an interleave mode signal that indicates use of the interleave address increase scheme when the interleave mode signal is a logic high.

6. The integrated circuit device according to claim 5, wherein the at least one logic signal is responsive to the 3-bit column address signal.

7. The integrated circuit device according to claim 6, wherein the at least one logic signal comprises first through eighth logic signals, wherein the burst length control signal is a logic low, wherein the sequential mode signal is a logic high and wherein each of the first through eighth logic signals are responsive to a first bit, a second bit and a third bit of the 3-bit column address signal.

8. The integrated circuit device according to claim 6, wherein the at least one logic signal comprises first through eighth logic signals, wherein the burst length control signal is a logic high, wherein the interleave mode signal is a logic high and wherein a first logic signal and a fifth logic signal are responsive to a third bit of the 3-bit column address signal.

9. The integrated circuit device according to claim 6, wherein the at least one logic signal comprises first through eight logic signals and wherein the logic circuit is further configured to activate one of the first through eighth logic signals and to combine the activated logic signal with the next three sequential logic signals to form a first group of four logic signals.

10. The integrated circuit device according to claim 9, wherein the logic circuit is further configured to form a second group of four logic signals including the remaining four of the first through eighth logic signals not combined with the activated signal to form the first group.

11. The integrated circuit device according to claim 10, wherein the first group of logic signals is activated during a first cycle of the clock in response to a first control signal and wherein the second group of logic signals is activated during a second cycle of the clock in response to a second control signal.

* * * * *

UNITED STATES PATENT AND TRADEMARK OFFICE
CERTIFICATE OF CORRECTION

PATENT NO. : 7,017,010 B2  
APPLICATION NO. : 10/338398  
DATED : March 21, 2006  
INVENTOR(S) : La Page 1 of 1

It is certified that error appears in the above-identified patent and that said Letters Patent is hereby corrected as shown below:

Column 15,
Line 10 should read -- eighth logic signals and wherein the logic circuit is further --

Signed and Sealed this

Eleventh Day of July, 2006

JON W. DUDAS
*Director of the United States Patent and Trademark Office*